Dec. 4, 1956 MASAO SAKAMOTO 2,773,131

MAGNETIC AMPLIFIER

Filed April 6, 1953

INVENTOR.

MASAO SAKAMOTO

BY George H. Fisher

ATTORNEY

United States Patent Office 2,773,131
Patented Dec. 4, 1956

2,773,131

MAGNETIC AMPLIFIER

Masao Sakamoto, Minneapolis, Minn., assignor to Minneapolis-Honeywell Regulator Company, Minneapolis, Minn., a corporation of Delaware Application April 6, 1953, Serial No. 347,099
7 Claims. (Cl. 179—171)

Figures 1, 2:
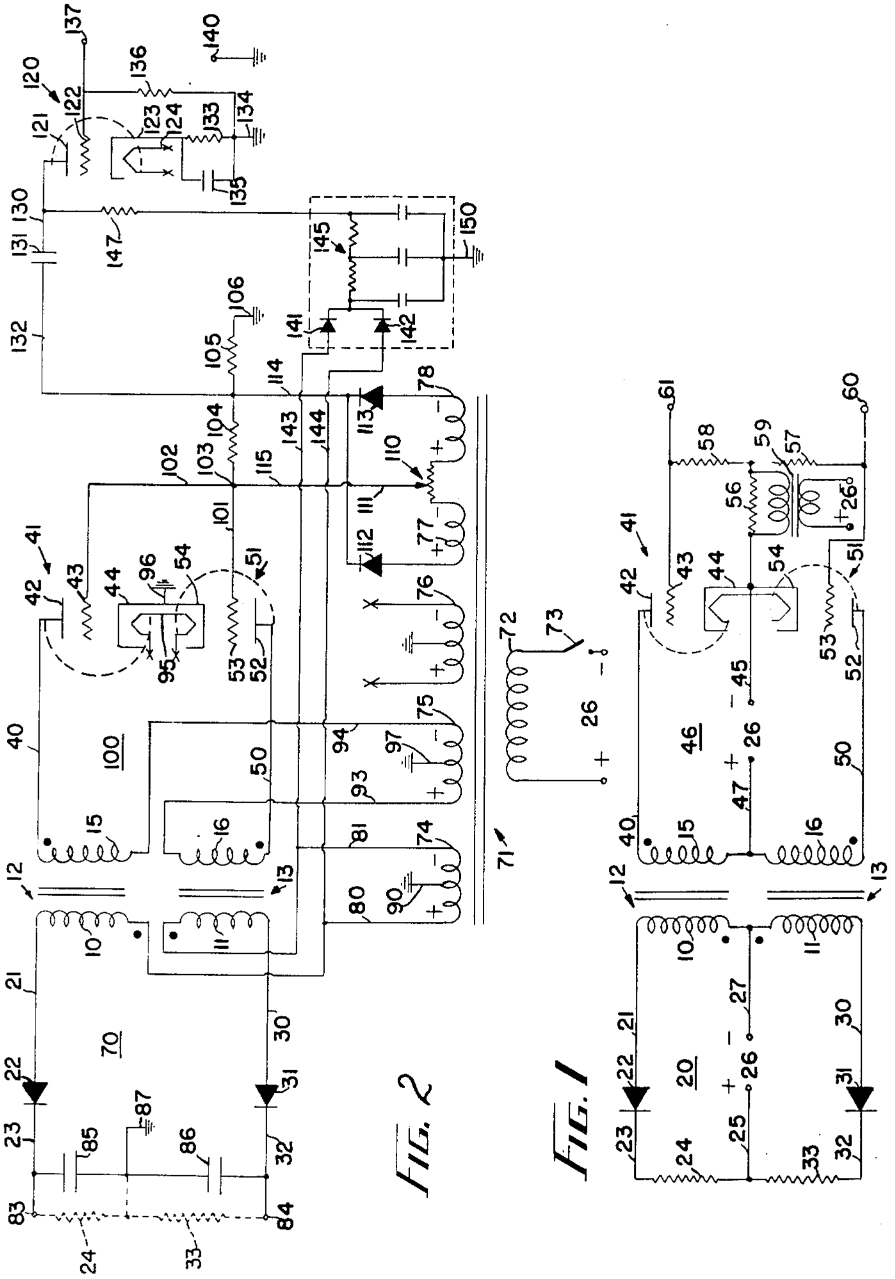

My invention relates to magnetic amplifiers and more particularly to an improved and modified magnetic amplifier utilizing certain electronic components to provide for electronic and magnetic amplification. This electronic magnetic amplifier will be hereinafter referred to as a hybrid amplifier.

In recent years, the development of magnetic materials and rectifiers have brought increased activity in the de- has presented definite advantages over other amplifying units. The magnetic amplifier in its more recent form has presented definite advantages over other amplifying equipment by virtue of its ruggedness, durability, lack of maintenance requirements and to a certain extent its ready adaptability into existing control circuits. One the other hand, however, it has presented for the most part higher initial cost, inasmuch as it employs premium magnetic materials and premium rectifiers, and presents certain weight and size limitations which can not compete with more recent developments in the electronic field. Further the magnetic amplifier for the most part does not have the sensitivity, response speed and range of amplification available to electronic equipment. Still further, with the magnetic amplifier the problem exists of adjusting control circuits to match the electrical characteristics of the amplifying device inasmuch as the latter are not readily changeable.

In the present invention, certain of the desirable features of the magnetic amplifier have been included with other of the desirable features of the electronic equipment to provide an improved electronic magnetic amplifying apparatus or an improved hybrid magnetic amplifier through which such advantages can be obtained. More specifically, in my invention the load carrying portion of the amplifying equipment is maintained as a magnetic amplifier and the current or voltage control for the controlling section of the magnetic amplifier has been modified to reduce the number of windings required on a conventional amplifier, to increase the amplification in this portion of the device, to improve on the impedance matching characteristics of the amplifier and to improve on the operating characteristics of the amplifier as a whole.

Therefore, it is an object of this invention to provide an improved magnetic amplifier having increased sensitivity and speed of response with larger amplification and greater stability.

It is also an object of this invention to provide an improved hybrid magnetic amplifier design which combines the desirable characteristics of the electronic and the magnetic amplifier.

It is further an object of this invention to provide an improved magnetic amplifier having better impedance matching characteristics such that it may readily be adapted to conventional control circuitry.

Further it is an object of this invention to provide an improved magnetic amplifier which is more economical to manufacture due to the reduction in the number of rectifiers required in the same and the number of windings employed on the amplifier.

Another object of this invention is to provide an improved magnetic amplifying device which has greater versatility than existing magnetic amplifying devices in that its input power requirements are exceedingly low, its input circuit impedance is relatively high making it easier to match with existing control circuits.

It is still another object of this invention to provide a hybrid magnetic amplifier which combines an electronic voltage amplifier with a magnetic amplifier unit.

These and other objects of this invention will become apparent from a reading of the attached description together with the drawings wherein Figure 1 is a schematic circuit disclosure of one embodiment of this invention, Figure 2 is a schematic circuit disclosure of a second embodiment of this invention.

My improved magnetic amplifier or hybrid magnetic amplifier is shown in the embodiment in Figure 1 providing a single stage of magnetic amplification and a stage of electronic amplification. In Figure 1, the numerals 10 and 11 indicate the power windings of the amplifier which are adapted to be mounted on a magnetic core, not shown, but indicated generally at 12 and 13 respectively, which cores also are provided with or include control windings 15, 16. These magnetic cores are magnetically independent of one another and as will be seen in the Figure 1, only the windings mounted thereon are electrically connected to one another. The power windings 10 and 11 are connected in a circuit to be hereinafter identified as a power circuit 20. Winding 10 is connected at one extremity through a conductor 21 to a halfwave rectifier 22 or unidirectional current conducting device and from a conductor 23 to a load resistor or load 24 with the opposite extremity of the load 24 being connected by conductor 25 to an alternating current source 26, the opposite extremity of an alternating current source 26 being connected by a conductor 27 to the opposite extremity of the winding 10. Power winding 11 is similarly connected at one extremity through a conductor 30 to a unidirectional current conducting device or halfwave rectifier 31 and from a conductor 32 to a load or resistor 33, this circuit being completed through the conductor 25, source 26 and conductor 27 to the extremity of the power winding 11. It will be noted that the circuits for the power windings 10 and 11 are connected in parallel across the A. C. source 26 and while the loads for the output or power circuit are shown herein as resistors 24 and 33 it will be understood that any type of device employing an electrical impedance may be powered from this output stage. As will be later noted, the current flow through the load circuit 20 will be unidirectional by virtue of the connection of the rectifiers 22 and 31 and will be selectively or proportionally energized as will be later noted depending upon which of the power windings is conducting at the greatest level.

The control windings 15, 16 are connected in control circuit indicated generally at 46 to the same A. C. power source or similar source of the same phase in the following manner. Control winding 15 of core 12 is connected at one extremity through a conductor 40 to a plate 42 of a triode or electronic valve 41 having a grid 43 and cathode 44, the cathode being connected by a conductor 45 to the alternating source 26 which is connected through a conductor 47 to the opposite extremity of the control winding 15. Control winding 16 is similarly connected by a conductor 50 to a plate 52 of a triode or electric valve 51 having grid 53 and cathode 54, which cathode is connected by the conductor 45 to the source 26 and from the conductor 47 to the opposite extremity of the winding 16. The cathodes 44 and 54 are connected together at a common point and to a biasing resistor 56 which in turn is connected to a common connection of a pair of grid resistors 57 and 58 the opposite extremities of which are connected to grids 53, 43 respectively and to a pair of terminals 60 and 61 through which an input signal may be impressed across the grid resistors. Biasing resistor 56 has a transformer 59 connected in parallel therewith and energized from A. C. source 26 for biasing resistor 56. The input signal to be impressed on terminals 60, 61 for this apparatus is adapted to be of the alternating current type, variable in magnitude and reversible in phase such that the relationship of the input signal with respect to the A. C. source 26 will be such as to vary the bias through the resistors 56 and 57 or 58 on the grids 53 and 43 to make one or the other of the triodes 51 and 41 more conductive respectively. The circuitry employed herein is of the push-pull input type having grid circuit discrimination, and the instantaneous polarities of the source 26 as it is connected in the power and control circuits is shown for a better understanding of the circuit.

The operation of this circuit like conventional magnetic amplifiers depends for its control on the current flow through the control windings 15 or 16 to vary the condition of the magnetic cores 12 or 13 with respect to the magnetization curve. The direction of the control and power windings, that is the magnetomotive forces produced respectively thereby is indicated by the dots adjacent the respective windings which indicates the beginning or end of the windings with respect to the core in a conventional manner. Further the cores utilized herein may be made of any high quality magnetic material and I have found that a rectangular loop material is best suited for this application. Current flow through the control winding in effect presets the core or the magnetization of the core so that the current flow through the power winding on the next alternate half cycle will be governed by the condition of magnetization of the magnetic core. The current flow through the control winding is unidirectional and opposes the power winding magnetomotive force to minimize the output of the apparatus. With the magnetization current through the control winding reduced, the magnetic circuit or core structure will saturate at some time during the conducting half cycle giving rise to the load current. In the present arrangement of circuitry, the magnetizing current for the control winding is supplied by the alternating current source 26 supplying the windings 15 and 16 through the triodes 41 and 51 in a parallel arrangement. Current flow through the triodes being unidirectional, will control or act as rectifiers to provide for unidirectional current flow through the respective windings 15 and 16. The amount of current flow through the respective triodes will of course be controlled by the bias on the grids 43, 53, respectively and the polarity of this bias with respect to the polarity of the plate and cathode of the triode. Biasing resistor 56 has impressed thereon a bias due to or potential due to the A. C. source 26 and at the same time the alternating current signal across the terminals 60, 61 will bias the resistors 57 and 58 to modify the bias of the alternating current source. With no A. C. signal across terminals 60 and 61, the bias voltage across resistor 56 and the A. C. source voltage 26 is such as to cause sufficient conduction by tubes 41 and 51 into control windings 15 and 16 to permit their respective power windings 10 and 11 to deliver one-half (or less) maximum load current to loads 24 and 25. Upon the application of signal, the voltages developed across resistors 58 and 57 varies the potential of grid 43 above the bias potential across 56 and varies the potential of grid 53 below the bias potential across 56 or vice versa depending upon the phase of the signal. Thus, one or the other of the tubes will be biased to a point where it will conduct to a greater degree than the opposing tube and this current flow will operate to preset the core to a condition where the current flow on the associated power winding will be reduced or cut off. As the magnitude of the input signal is increased, the amount of current flow through the respective control windings on alternate half cycles will be such as to increase with respect to one winding and decrease to another driving their power windings to a condition where one power winding will not conduct at all and the other will conduct at a very large magnitude. A reversal of phase of the input signal will reverse the arrangement or relationship between the windings which are conducting and those which are inactive. It will thus be seen that at maximum operating condition, one or the other of the load resistors will be carrying a full or maximum current while the other load resistors will have no current flow therethrough. It will further be noted that through the use of triodes, phase discrimination is obtained and that a certain amount of amplification is obtained between the magnitude of the input signal and the current flow through the control windings 15 and 16.

The embodiment shown in Figure 2 is a modification of the circuit shown in Figure 1 having a single ended input and plate circuit discriminator together with a stage of electronic voltage amplification on the input to the amplifier. In this circuit, the power windings 10 and 11 of cores 12 and 13 are connected in a modified power circuit indicated generally at 70. The alternating current supply 26 in this embodiment is again shown with instantaneous polarity marking and is connected through a power transformer 71 having a primary winding 72 with a disconnect switch 73 to isolate the transformer and a plurality of secondary windings 74, 75, 76, 77 and 78. Similarly the power and control windings are marked with dots to show the beginning or ends of the windings with respect to the cores associated therewith for purposes previously noted. Power windings 10 and 11 are connected at their extremities to the extremities of the secondary winding 74 through conductors 80 and 81, the opposite extremities of the power windings 10 and 11 being connected by conductors 21 and 30 respectively to the halfwave rectifiers 22 and 31 respectively and from the rectifiers through conductors 23 and 32 to terminals 83, 84 across which a load such as resistors 33, 24 shown in dotted lines are adapted to be connected. Connected between the conductors 23 and 32 are filtering condensers 85 and 86 in series connection with their common connection being grounded as at 87. Similarly, the secondary winding 74 is grounded at its midpoint as at 90 to provide for a return path to the energizing source from the load circuit. The load to be connected to the terminals 83, 84 may be a grounded resistor type load or any other type of impedance with a ground connection for the return path. If it is desired that an alternating current type of load device be used in the load circuit, then the terminals 83, 84 should be connected together and the load connected between the common connection and ground (not shown) with the filter condensers connected in parallel across the load.

Control windings 15 and 16 are connected in a control circuit 100 with one of their extremities connected to the extermities of the secondary winding 75 through conductors 93, 94 and with their opposite extremities connected by conductors 40 and 50 to triodes 41 and 51 having the plates 42, 52, grids 43, 53, and cathodes 44, 54 respectively. Heaters are shown for the cathodes at 95 with broken connections indicated that they are to be connected to the secondary winding 76 which supplies the heater load for the tubes. The cathodes 44, 54 are tied together in a common point which is grounded at 96 and the secondary winding 75 is similarly grounded at a midpoint 97. It will thus be seen that the power windings and the control windings are energized respectively from portions of the same transformer and in an opposite sense from the type of energization employed in Figure 1. Both the power circuit 70 and the control circuit 100 are of push-pull type. The grids 43 and 53 of the triodes 41 and 51 are connected together through conductors 101 and 102 at a common point 103 and from the common point 103 through a biasing resistor 104 and a grid resistor 105 to a ground connection 106. As will be noted hereinafter, the biasing resistor 104 is adapted to have a pulsing unidirectional voltage applied thereto from the secondary windings 77 and 78 which are connected together through a potentiometer 110 having a wiper 111, the opposite extremities of the secondary windings 77 and 78 being connected through halfwave rectifiers 112 and 113 to a common conductor 114 which in turn is connected to the common connection between resistors 104 and 105. This circuit is completed through the conductor 115 which is connected at one extremity to the common point 103 of the grids 43 and 53 and at the other extremity to the wiper 111 of the adjusting potentiometer 110. It will be seen from this arrangement that on alternate half cycles a unidirectional current will flow through the respective rectifiers 112 or 113 and conductor 114 to biasing resistor 104 and returning through the conductor 115 to the potentiometer 110 and secondary windings 77 or 78. The potentiometer 110 is included to adjust or balance the biasing voltage supplied to the resistor 104 on alternate half cycles so that the voltage across each of the power windings 10 and 11 will be in balance when no signal is applied to the amplifier. The voltage applied through the biasing resistor 104 to the triodes 41 and 51 will be such as to cause each tube to conduct equally, energizing alternately the windings 15, 16 to the same degree. The bias voltage and the voltage due to transformer winding 75 will be such as to magnetize the respective cores 12 and 13 such that the power windings will have susbtantially reduced current flow therethrough. It will be seen in this arrangement, that the conductivity of the tubes will be determined by the polarities of the respective plates of the tubes 41 and 51 as well as the polarities impressed on the power windings 10 and 11.

Control of the triodes 41 and 51 is completed through the grid resistor 105 which is grounded at 106. An amplifier input signal is impressed upon this biasing resistor from the conventional voltage amplifier indicated generally at 120 as comprising a conventional triode having a plate 121, grid 122 and cathode 123 with heaters 124. The plate 121 is connected by a conductor 130 through a coupling condenser 131 and a conductor 132 to the biasing resistor 105 and ground connection 106. The cathode 123 of the tube is connected through a biasing resistor 133 to a ground connection 134 completing this circuit. The biasing resistor 133 has a condenser 135 connected in parallel therewith and the grid 122 has a biasing resistor 136 connected thereto and to the ground connection 134. Input to the grid is made through a terminal 137, the input signal source being indicated as grounded at its opposite extremity as at 140. The input signal to be applied hereto is of the alternating current type being variable in magnitude and reversible in phase. The B plus supply or power supply for the voltage amplifier is obtained through a pair of rectifiers 141 and 142 connected by conductors 143 and 144 to opposite extremities of the secondary winding 74 of transformer 71 and through a filtering circuit indicated generally at 145 to a loading resistor 147, the filtering network being grounded as at 150. The actual details of the power supply for the voltage amplifier and the voltage amplifier itself form no part of the subject invention in as much as they are conventional. The voltage amplifier 120 will respond in output to an input signal impressed across the terminals 137, 140 and will amplify in a conventional manner. The output of this amplifier is coupled to the condenser 137 and load resistor 147 to the biasing resistor 105 impressing the amplified signal across the biasing resistor which bias together with the bias across the resistor 104 due to the energization of the secondary windings 77 and 78 will cause one or the other of the triodes 41 and 51 to be conductive to a greater extent than the opposite triode and under certain conditions to completely cut off conduction of one tube and provide for peak conduction in the opposite tube depending upon the magnitude of the input signal. This will cause a variation in current flow which is selective through the windings 15 and 16 to magnetize or preset the cores 12 and 13 and cause one or the other of the power windings to conduct to a greater or lesser extent and under the circumstances of a high input signal to cause one winding to conduct at maximum capacity while the other does not conduct at all and thereby energize portions of the load connected across the terminals 83, 84 with a unidirectional current. In this embodiment two stages of electronic amplification are obtained in that the voltage amplifier together with the amplification received from the triodes 41 and 51 permit a very small input signal to be used to control a current supplied in the control circuit 100 from the secondary winding 75. This current is rectified through operation of the tubes 41 and 51 in the well known manner. The core materials of the cores in this embodiment should also be of the rectangular loop type for best results.

In both of these devices it will be seen that the input to the hybrid amplifiers is such that relatively high impedance control circuits may be associated or coupled with the amplifier. It will further be seen that the input circuit or control circuit which is supplied by the alternating signal actually supplies no power to the control winding but merely serves as a reference in controlling the current flow supplied from the alternating current source 26. It will also be seen that the number of premium rectifiers employed in this circuitry is greatly reduced in number from that required in prior art devices. An increase amplification and greater sensitivity is obtained with this circuitry as well as excellent stability with variation or fluctuation in the alternating current supply.

In considering this invention it should be kept in mind that the present disclosure is intended to be illustrative only and the scope of the invention should be determined only by the appended claims.

I claim as my invention:

1. A hybrid magnetic amplifier comprising, a pair of magnetic cores, each core having a power winding and a control winding positioned thereon in inductive relation therewith, an alternating current source of power having a plurality of terminals, circuit means connecting one terminal of each of said power windings to said source of power and another terminal of each of said power windings through unidirectional current conducting devices respectively through load means which circuit is completed to another terminal of said source of power, additional circuit means connecting each of said control windings to a terminal of said source of power and further connecting each of said control windings to anodes of a pair of triodes respectively each triode having a control element and a cathode with the additional circuit being completed through common connections of said cathode and said source of power, control circuit means including biasing resistance means connected to the control element of said triodes, means for applying a refence signal to said biasing resistance means, and means applying an alternating signal voltage of variable phase and magnitude to said biasing resistance means.

2. A hybrid magnetic amplifier comprising, a pair of magnetic cores, a power winding and a control winding positioned on each of said magnetic cores in inductive relation therewith, an alternating current supply source, load means, circuit means directly connecting a terminal of each of said power windings to said supply source and another terminal of each of said power windings through unidirectional current conducting devices respectively and through said load means which circuit is completed to said source of power, additional circuit means connecting each of said control windings to a terminal of said source of power and connecting another terminal of each of said control windings to anodes of a pair of triodes respectively each having a control element and a cathode with the additional circuit means being completed through common connections of said cathode and said source of power, biasing circuit means including a resistor connected to the control elements of said triodes, means connecting a reference signal of fixed polarity to said biasing circuit means, and input circuit means connected to said biasing circuit means applying an alternating signal voltage of variable phase and magnitude to said biasing circuit means to vary the bias on said triodes and cause one or the other of said triodes to conduct on alternate half cycles and in varying degrees to control the amount of current through said control windings.

3. In a magnetic amplifier, a pair of magnetic core members, each core member having a power winding and a control winding positioned thereon in inductive relation therewith, an alternating current source of power including a transformer having a primary winding and a plurality of center tapped secondary windings, circuit means connecting one extremity of each of said power windings to the extremities of one of said secondary windings of said transformer and the other extremity of each power winding through a uni-directional current conducting device to opposite extremities of a load consumption circuit respectively which circuit is completed to the center tap of said one of said secondary windings, additional circuit means connecting one extremity of each of said control windings to the extremities of a second of said secondary windings of said transformer and the other extremity of each of said control windings to plates of a pair of electron tubes respectively each having a control grid and a cathode with the circuit being completed through grounded connections of said cathode and the center tap of said second of said secondary windings, control circuit means including a biasing resistance means connected to the grids of said tubes, means for applying a pulsating uni-directional current to said biasing resistance means, and means applying an alternating signal voltage to said biasing resistance means which voltage varies in phase and magnitude.

4. In a magnetic amplifier, a pair of magnetic core members, each core member having a power winding and a control winding positioned thereon in inductive relation therewith, an alternating current source of power including a transformer having a primary winding and a plurality of center tapped secondary windings, circuit means connecting one extremity of each of said power windings to the extremities of one of said secondary windings of said transformer and the other extremity of each power winding through a uni-directional current conducting device to opposite extremities of a load consumption circuit respectively which circuit is completed to the center tap of said one of said secondary windings, additional circuit means connecting one extremity of each of said control windings to the extremities of a second of said secondary windings of said transformer and the other extremity of each of said control windings to plates of a pair of electron tubes respectively each having a control grid and a cathode with the circuit being completed through grounded connections of said cathode and the center tap of said second of said secondary windings, control circuit means including a biasing resistance means connected to the grids of said tubes, means applying a reference signal to said biasing resistance means, and means applying an alternating signal voltage to said biasing resistance means which voltage varies in phase and magnitude.

5. In a magnetic amplifier, a pair of magnetic core members, each core member having a power winding and a control winding positioned thereon in inductive relation therewith, an alternating current source of power including a transformer having a primary winding and a plurality of center tapped secondary windings, circuit means connecting one extremity of each of said power windings to the extremities of one of said secondary windings of said transformer and the other extremity of each power winding through a uni-directional current conducting device to opposite extremities of a load consumption circuit respectively which circuit is completed to the center tap of said one of said secondary windings, additional circuit means connecting one extremity of each of said control windings to the extremities of a second of said secondary windings of said transformer and the other extremity of each of said control windings to plate of a pair of electron tubes respectively each having a control grid and a cathode with the circuit being completed through grounded connections of said cathode and the center tap of said second of said secondary windings, control circuit means including a biasing resistance means connected to the grids of said tubes, means for applying a pulsating uni-directional current to said biasing resistance means, and voltage amplifying means connected to said biasing resistance means and applying a signal thereto which varies in phase and magnitude.

6. In a magnetic amplifier, a pair of magnetic core members, each core member having a power winding and a control winding positioned thereon in inductive relation therewith, an alternating current source of power including a transformer having a primary winding and a plurality of center tapped secondary windings, circuit means connecting one extremity of each of said power windings to the extremities of one of said secondary windings of said transformer and the other extremity of each power winding through a uni-directional current conducting device to opposite extremities of a load consumption circuit respectively which circuit is completed to the center tap of said one of said secondary windings, additional circuit means connecting one extremity of each of said control windings to the extremities of a second of said secondary windings of said transformer and the other extremity of each of said control windings to plate of a pair of electron tubes respectively each having a control grid and a cathode with the circuit being completed through grounded connections of said cathode and the center tap of said second of said secondary windings, control circuit means including a biasing resistance means connected to the grids of said tubes, means for applying a pulsating uni-directional current to said biasing resistance means, and electronic voltage amplifying means coupled to said biasing resistance means and applying a signal thereto which varies in phase and magnitude.

7. In a magnetic amplifier, a pair of magnetic core members, each core member having a power winding and a control winding positioned thereon in inductive relation therewith, an alternating current source of power including a transformer having a primary winding and a plurality of center tapped secondary windings, circuit means connecting one extremity of each of said power windings to the extremities of one of said secondary windings of said transformer and the other extremity of each power winding through a uni-directional current conducting device to opposite extremities of a load consumption circuit respectively which circuit is completed to the center tap of said one of said secondary windings, additional circuit means connectng one extremity of each of said control windings to the extremities of a second of said secondary windings of said transformer and the other extremity of each of said control windings to plate of a pair of electron tubes respectively each having a control grid and a cathode with the circuit being completed through grounded connections of said cathode and the center tap of said second of said secondary windings, means biasing the grids of said tubes with a reference signal of fixed polarity, and means applying input signal of alternating polarity to vary the bias on said triodes causing said tubes to conduct on all alternating half cycles and in varying degrees to vary the amount of current through said control windings.

References Cited in the file of this patent

UNITED STATES PATENTS

| | | |
|---|---|---|
| 2,037,659 | Schade | Apr. 14, 1936 |
| 2,124,600 | Worral | July 26, 1938 |
| 2,229,952 | Whiteley et al. | Jan. 28, 1941 |
| 2,388,070 | Middell | Oct. 30, 1945 |
| 2,399,586 | Toomim | Apr. 30, 1946 |
| 2,453,624 | Glass | Nov. 9, 1948 |
| 2,458,937 | Glass | Jan. 11, 1949 |
| 2,503,039 | Glass | Apr. 4, 1950 |
| 2,598,221 | Burton | May 27, 1952 |
| 2,679,621 | Houck | May 25, 1954 |